United States Patent
Boyko et al.

(10) Patent No.: US 7,957,111 B2
(45) Date of Patent: Jun. 7, 2011

(54) DIFFERENTIAL CURRENT OUTPUT DRIVER WITH OVERVOLTAGE PROTECTION

(75) Inventors: Daniel T. Boyko, Norwood, MA (US); Chih Chuan Che, Norwood, MA (US)

(73) Assignee: Analog Devices, Inc., Norwood, MA (US)

( * ) Notice: Subject to any disclaimer, the term of this patent is extended or adjusted under 35 U.S.C. 154(b) by 553 days.

(21) Appl. No.: 12/070,280

(22) Filed: Feb. 15, 2008

(65) Prior Publication Data
US 2009/0206887 A1   Aug. 20, 2009

(51) Int. Cl.
*H02H 3/20* (2006.01)
*H02H 9/00* (2006.01)

(52) U.S. Cl. ............................ 361/56; 361/111; 361/91.1
(58) Field of Classification Search .................. 361/91.1, 361/56, 111
See application file for complete search history.

(56) References Cited

U.S. PATENT DOCUMENTS

| | | | |
|---|---|---|---|
| 4,453,092 A | 6/1984 | Joseph | |
| 5,019,720 A | 5/1991 | Skoog et al. | |
| 6,225,867 B1 * | 5/2001 | Ilowski et al. | 330/298 |
| 6,618,230 B2 * | 9/2003 | Liu et al. | 361/56 |
| 6,784,624 B2 * | 8/2004 | Buonocunto | 315/247 |
| 6,919,696 B2 * | 7/2005 | Van Casteren | 315/291 |
| 7,245,155 B2 * | 7/2007 | Watarai | 326/83 |

FOREIGN PATENT DOCUMENTS
EP   0 454 091   10/1991

OTHER PUBLICATIONS

Chow, Hwang-Cherng et al., *A Reliable and High Voltage Compatible CMOS I/O Buffer*, The 47th IEEE International Midwest Symposium on Circuits and Systems, 2004, pp. III-451-III-454.
Mandal, Debashis et al., *High Voltage Tolerant Output Buffer Design for Mixed Voltage Interfaces*, Alliance Semiconductor (I) Pvt. Ltd (ALSC), 2005 IEEE, pp. 4277-4280.
Annema, Anne-Johan et al., *5.5-V I/O in a 2.5-V 0.25-μm CMOS Technology*, IEEE Journal of Solid State Circuits, vol. 36, No. 3, Mar. 2001, pp. 528-538.
Search Report and Written Opinion dated May 28, 2009 from corresponding International Application No. PCT/US2009/000881.

* cited by examiner

*Primary Examiner* — Stephen W Jackson
*Assistant Examiner* — Zeev Kitov
(74) *Attorney, Agent, or Firm* — Bingham McCutchen LLP

(57) ABSTRACT

A differential current output driver and a method for overvoltage protection of a differential current output driver circuit are provided. The output driver includes a differential current output driver circuit operable by a power supply voltage and including first and second driver transistors in a differential current configuration and first and second output pads, and an overvoltage protection circuit configured to generate a protected voltage in response to a voltage on at least one of the first and second output pads and an absence of the power supply voltage, and to apply the protected voltage to at least one transistor of the differential current output driver circuit.

17 Claims, 8 Drawing Sheets

DIFFERENTIAL CURRENT OUTPUT DRIVER WITH OVERVOLTAGE PROTECTION

FIELD OF THE INVENTION

This invention relates to protection of integrated circuits against electrical overstress applied to external pads and, more particularly, to differential current output driver circuits with overvoltage protection and to methods for overvoltage protection of differential current output driver circuits.

BACKGROUND OF THE INVENTION

Current VLSI (Very Large-Scale Integrated Circuit) chips implemented with submicron process technology have extremely small geometries and operate at low power supply voltages, such as 3 volts or less. Such VLSI chips are susceptible to electrical overstress applied to an external pad of the chip. For example, a voltage in excess of the rated voltage of transistors connected to an external pad may cause those transistors to fail. The electrical overstress can be applied to the chip at any time, such as during testing or use in a final product. However, some configurations are more susceptible to electrical overstress than others. For example, chips connected to external devices or connectors are particularly susceptible to inadvertent application of an overvoltage. One specific example is a USB (Universal Serial Bidirectional) communication port, which is in common usage on computer equipment.

Circuits are known to protect output drivers against overvoltage in the case where the power supply voltage is turned on. However, such circuits do not protect the output driver in cases where the power supply voltage is turned off, is at a low voltage, is open-circuited or is connected to ground. Nonetheless, it is desirable to provide overvoltage protection under these conditions in order to prevent inadvertent damage to such circuits. The overvoltage may occur at any time and is not limited to periods when the power supply voltage is turned on. For example, some manufacturers may require the USB port to withstand an overvoltage of 5.25 volts, regardless of whether the power supply voltage is on or off.

Accordingly, there is a need for improved methods and apparatus for overvoltage protection of differential current output driver circuits in integrated circuits.

SUMMARY OF THE INVENTION

According to a first aspect of the invention, an output driver is provided in an integrated circuit. The output driver comprises a differential current output driver circuit operable by a power supply voltage and including first and second driver transistors in a differential current configuration and first and second output pads, and an overvoltage protection circuit configured to generate a protected voltage in response to a voltage on at least one of the first and second output pads and an absence of the power supply voltage, and to apply the protected voltage to at least one transistor of the differential current output driver circuit.

The overvoltage protection circuit may comprise a first driver power conditioner configured to provide a first fractional pad voltage as a first protected voltage in response to an absence of the power supply voltage, a second driver power conditioner configured to provide a second fractional pad voltage as a second protected voltage in response to an absence of the power supply voltage, and a maximum value detector to select a maximum value of the first and second protected voltages and to provide the selected maximum value to the differential current output driver circuit as a composite protected voltage.

According to a second aspect of the invention, a method is provided for overvoltage protection of a differential current output driver circuit in an integrated circuit, the differential current output driver circuit operable by a power supply voltage and including first and second driver transistors in a differential current configuration and first and second output pads. The method comprises generating a protected voltage in response to a voltage on at least one of the output pads and an absence of the power supply voltage; and applying the protected voltage to at least one transistor of the differential current output driver circuit.

The protected voltage may be generated by generating a first fractional pad voltage in response to a voltage on the first output pad, providing the first fractional pad voltage as a first protected voltage in response to an absence of the power supply voltage, generating a second fractional pad voltage in response to a voltage on the second output pad, providing the second fractional pad voltage as a second protected voltage in response to an absence of the power supply voltage, selecting a maximum value of the first and second protected voltages, and providing the selected maximum value to the differential current output driver circuit as a composite protected voltage.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
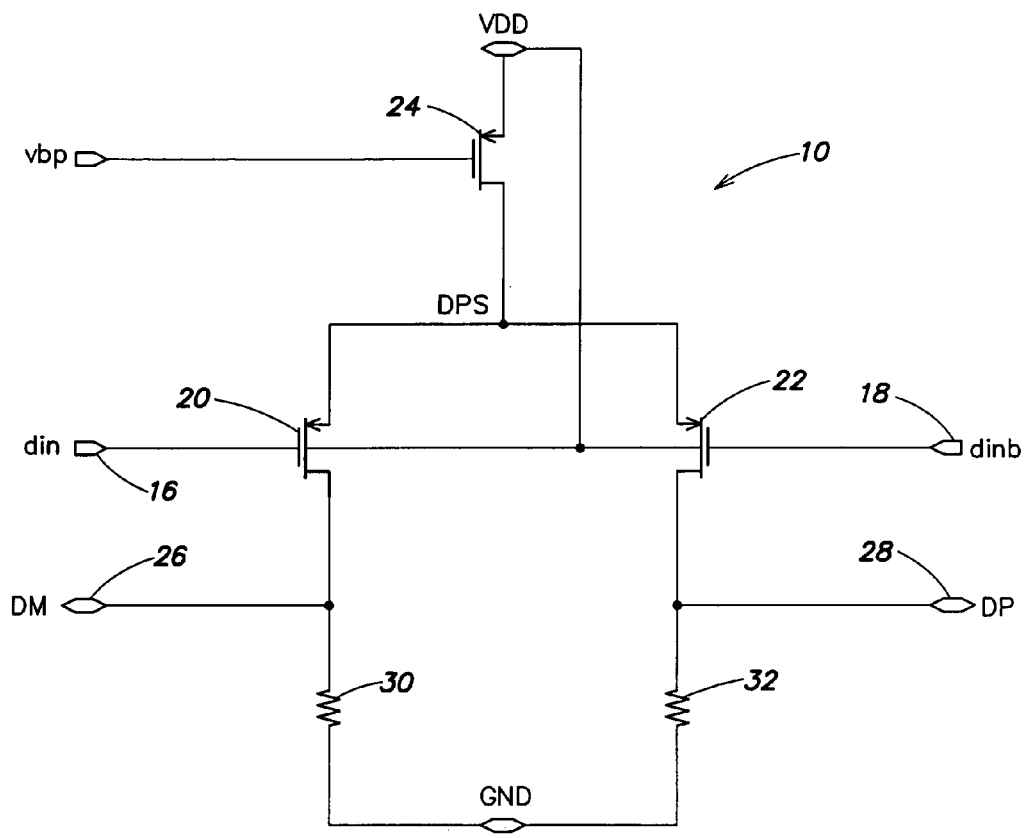
FIG. 1 is a schematic diagram of a prior art differential current output driver circuit.

A schematic diagram of a prior art differential current output driver circuit 10 is shown in FIG. 1. PMOS transistors 20 and 22 are connected in a differential current configuration and receive differential inputs 16 and 18, respectively. A PMOS transistor 24 functions as a current source, and transistors 20 and 22 supply current to output pads 26 and 28, respectively. A resistor 30 is connected between output pad 26 and ground, and a resistor 32 is connected between output pad 28 and ground. Resistors 30 and 32 may be connected to ground or to another reference voltage that provides sufficient operating voltage. Resistors 30 and 32 may be replaced with elements such as transistors operating as resistors, or combinations of active elements and resistors.

When the differential current output driver circuit of FIG. 1 is operating with supply voltage VDD at 3 volts and one of the output pads 26, 28 is subjected to a voltage of 5.25 volts, transistors 20, 22 and 24 are overstressed and a large amount of current is injected into the VDD supply. If supply voltage VDD is shorted to ground and output pad 28 is subjected to a voltage of 5.25 volts, transistor 22 is subjected to electrical overstress. Accordingly, there is a need for improved differential current output driver circuits.

Figure 2A:
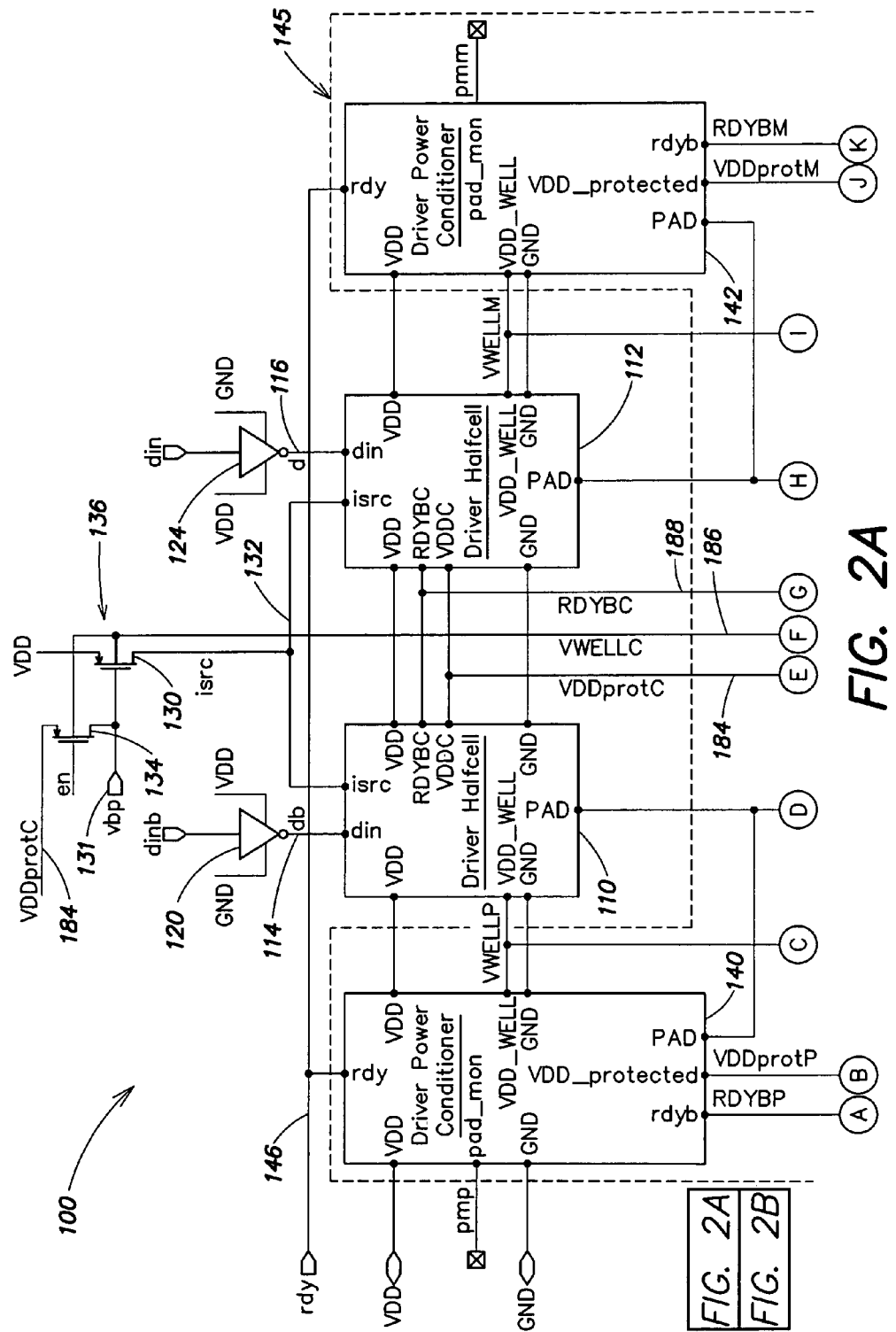
FIG. 2 is a schematic block diagram of an output driver in accordance with an embodiment of the invention.
Figure 2B:
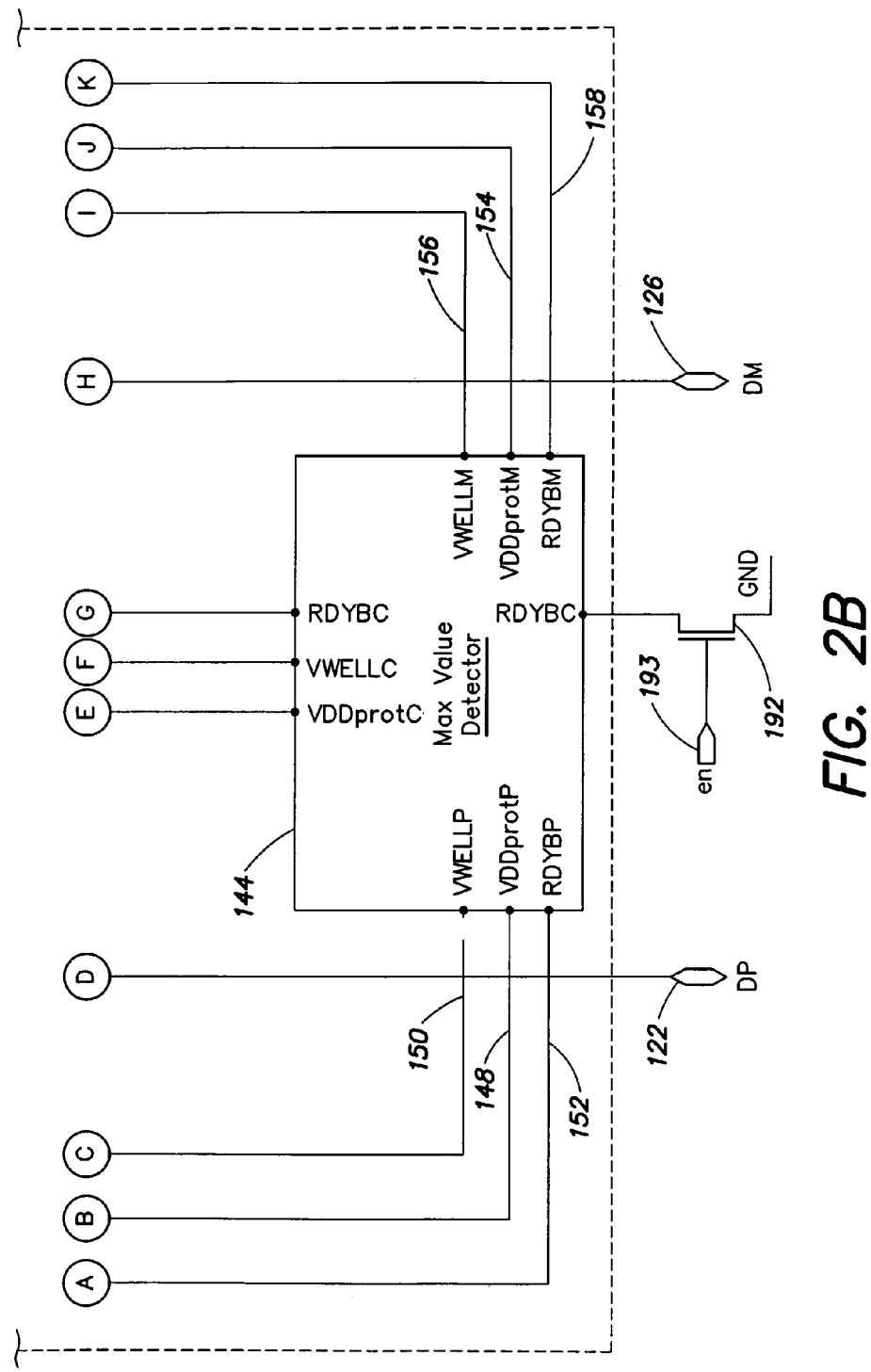

A block diagram of an output driver 100 in accordance with an embodiment of the invention is shown in FIG. 2. Output driver 100 includes a first driver halfcell 110 and a second driver halfcell 112 connected in a differential current configuration as described below. Driver halfcell 110 receives an input signal 114 through a logic gate 120 and provides an output signal to an output pad 122. Driver halfcell 112 receives an input signal 116 through a logic gate 124 and provides an output signal to an output pad 126. Input signals 114 and 116 have inverted, or opposite, logic states; and output pads 122 and 126 provide output signals that also have inverted, or opposite, logic states.

A PMOS transistor 130 supplies current to a current source input 132 of driver halfcells 110 and 112. A PMOS transistor 134 protects current source transistor 130. Transistor 134 disables transistor 130 by pulling input 131 to composite protected supply voltage 184. This prevents transistor 130 from passing current from output pads 122 or 126 to power supply VDD. Transistors 130 and 134 constitute a current source 136 for driver halfcells 110, 112. Together, driver halfcells 110, 112 and current source 136 constitute a differential current driver circuit.

Output driver 100 further includes a first driver power conditioner 140, a second driver power conditioner 142 and a maximum value detector 144. The driver power conditioners 140 and 142 provide protection against electrical overstress as described below. Together, driver power conditioners 140 and 142 and max value detector 144 constitute an overvoltage protection circuit 145 for the differential current driver circuit.

Power conditioner 140 is connected to power supply voltage VDD and ground, and to output pad 122. In addition, power conditioner 140 receives a ready signal 146 which indicates the presence of power supply voltage VDD. Power conditioner 140 provides a first protected supply voltage 148 to max value detector 144. In the embodiment of FIG. 2, power conditioner 140 supplies a first protected well voltage 150 to driver halfcell 110 and to max value detector 144. Power conditioner 140 also supplies a first inverted ready signal 152 to max value detector 144.

Similarly, power conditioner 142 is connected to power supply voltage VDD and ground, and to output pad 126. In addition, power conditioner 142 receives the ready signal 146 which indicates the presence of power supply voltage VDD. Power conditioner 142 provides a second protected supply voltage 154 to max value detector 144. In the embodiment of FIG. 2, power conditioner 142 supplies a second protected well voltage 156 to driver halfcell 112 and to max value detector 144. Power conditioner 142 also supplies a second inverted ready signal 158 to max value detector 144.

Max value detector 144 receives the first protected supply voltage 148 from power conditioner 140 and the second protected supply voltage 154 from power conditioner 142 and provides a composite protected supply voltage 184 to driver halfcells 110 and 112. As described below, the composite protected supply voltage 184 is at supply voltage VDD when supply voltage VDD is present and is at a fractional pad voltage when supply voltage VDD is absent. The fractional pad voltage is derived from a voltage applied to at least one of output pads 122 and 126.

Max value detector 144 also receives first protected well voltage 150 from power conditioner 140 and second protected well voltage 156 from power conditioner 142 and provides a composite protected well voltage 186 to the wells of transistors 130 and 134. As further described below, the composite protected well voltage 186 is at supply voltage VDD when supply voltage VDD is present and is at the fractional pad voltage when supply voltage VDD is absent.

In addition, max value detector 144 receives first inverted ready signal 152 from power conditioner 140 and second inverted ready signal 158 from power conditioner 142 and provides a composite inverted ready signal 188 to driver halfcells 110 and 112. As further described below, the composite inverted ready signal 188 is near zero volts when supply voltage VDD is present and is approximately at the fractional pad voltage when supply voltage VDD is absent.

Thus, the composite protected supply voltage 184, the composite protected well voltage 186 and the composite inverted ready signal 188 all correspond to the maximum of the fractional pad voltages when supply voltage VDD is absent and may be considered as protected voltages. The protected voltages are applied to the differential current output driver circuit to provide overvoltage protection.

An NMOS transistor 192 coupled to the composite inverted ready signal 188 provides the capability to enable or disable the inverted ready signal. Transistor 192 provides a hard pulldown to near zero volts on inverted ready signal 188 in the case when power supply voltage VDD is applied and the output driver is enabled. Enable signal 193 may be tied to ready signal 146 in some embodiments.

Figure 3:
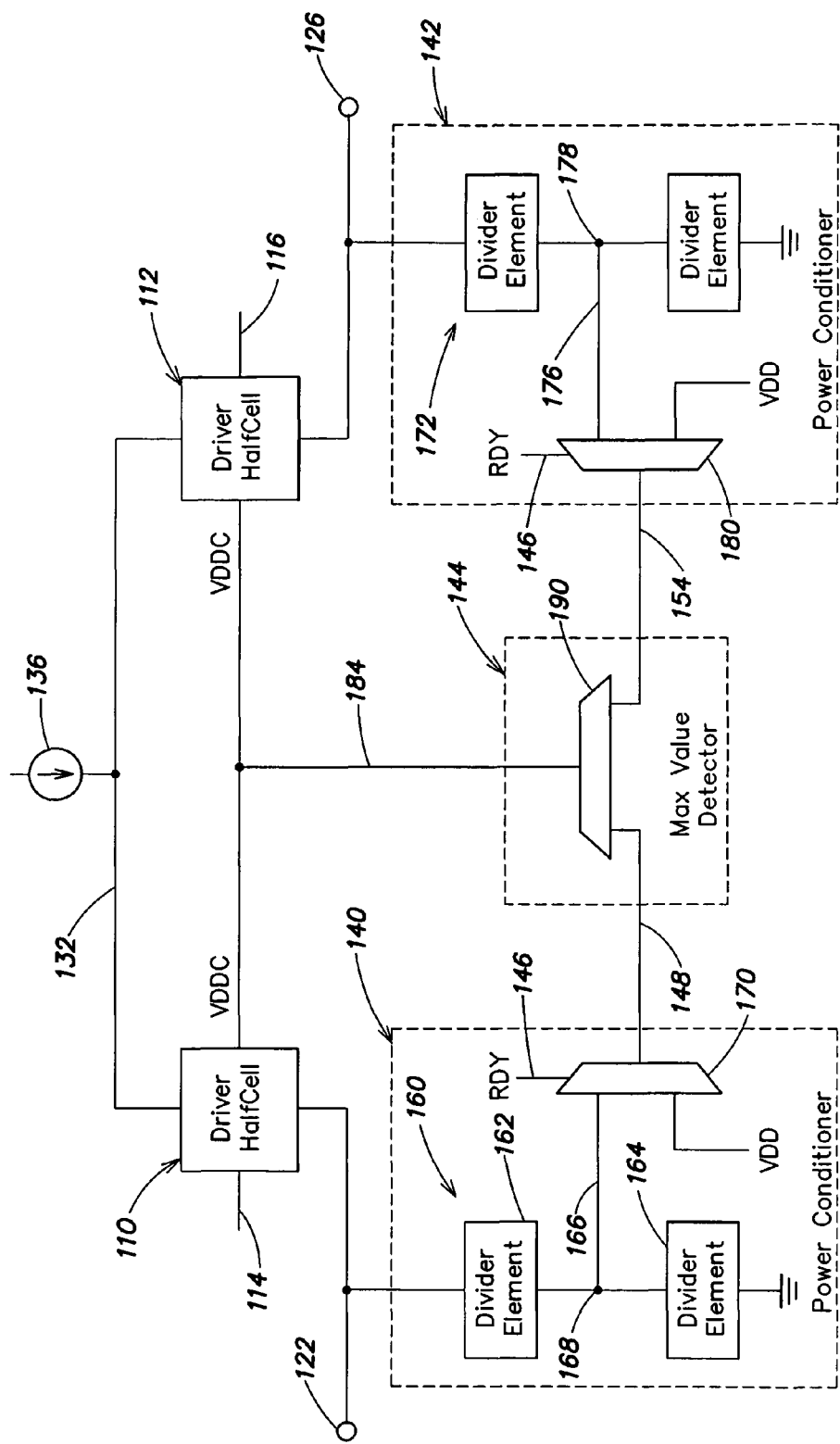
FIG. 3 is a simplified block diagram that illustrates overvoltage protection of a differential current output driver circuit in accordance with an embodiment of the invention.

A simplified block diagram of output driver 100 is shown in FIG. 3. The generation of the composite protected supply voltage for operation of the differential current output driver circuit is shown in FIG. 3. Power conditioner 140 may include a voltage divider 160 coupled between output pad 122 and ground. Voltage divider 160 includes a first divider element 162 and a second divider element 164 connected in series. A node 168 connects first divider element 162 and second divider element 164. When a voltage is present on output pad 122, a first fractional pad voltage 166 is present on node 168. The magnitude of the first fractional pad voltage is a function of the voltage on output pad 122 and the divider ratio of divider elements 162 and 164. In some embodiments, the fractional pad voltage is about one half of the voltage on output pad 122. However, the invention is not limited in this respect. The divider ratio of voltage divider 160 is selected to produce a fractional pad voltage that protects the transistors in the driver halfcells 110, 112, for a given maximum voltage on output pad 122.

Power conditioner 140 further includes a multiplexer 170 having a first input that receives supply voltage VDD and a second input that receives the first fractional pad voltage 166 from voltage divider 160. Multiplexer 170 includes a control input that receives the ready signal 146 and an output that supplies the first protected supply voltage 148 to max value detector 144. When the ready signal 146 indicates that the supply voltage VDD is present, multiplexer 170 provides supply voltage VDD as the first protected supply voltage 148. When the ready signal 146 indicates that the power supply voltage VDD is not present, multiplexer 170 provides the first fractional pad voltage 166 as the first protected supply voltage 148. It will be understood that a non-zero fractional pad voltage is present only in the case of a voltage on output pad 122.

In a similar manner, power conditioner 142 includes a voltage divider 172 coupled between output pad 126 and ground. When a voltage is present on output pad 126, a second fractional pad voltage 176 is present on node 178. Power conditioner 142 further includes a multiplexer 180 having a first input that receives supply voltage VDD and a second input that receives the second fractional pad voltage 176 from voltage divider 172. Multiplexer 180 includes a control input that receives the ready signal 146 and an output that supplies the second protected supply voltage 154 to max value detector 144. When the ready signal 146 indicates that the supply voltage VDD is present, multiplexer 180 provides the supply voltage VDD as the second protected supply voltage 154. When the ready signal 146 indicates that the power supply voltage VDD is not present, multiplexer 180 provides the second fractional pad voltage 176 as the second protected supply voltage 154.

The max value detector 144 includes a maximum value selector 190 that receives the first protected supply voltage 148 and the second protected supply voltage 154 and selects the maximum value of the first and second protected supply voltages. The maximum value selector 190 provides the selected maximum value to the differential current output driver circuit as composite protected supply voltage 184. The composite protected supply voltage 184 protects the differential current driver circuit from damage due to electrical overstress as described below.

Figure 3A:
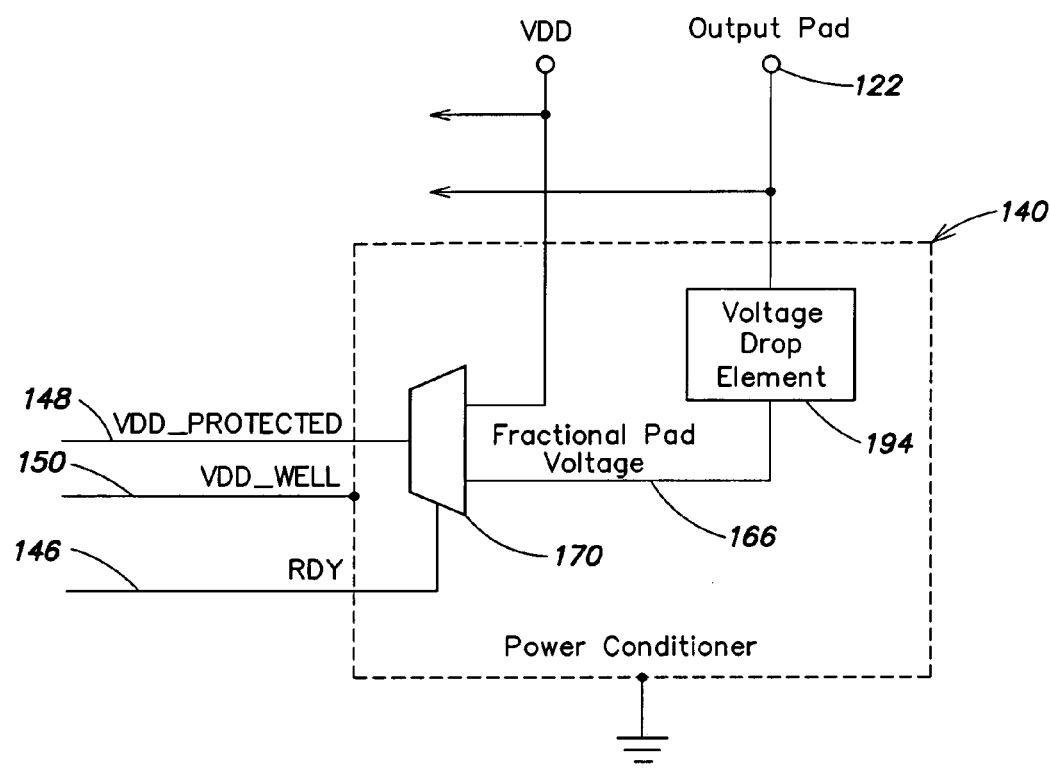

A block diagram of power conditioner 140 in accordance with another embodiment of the invention is shown in FIG. 3A. As in FIG. 3, power conditioner 140 is connected to power supply voltage VDD and ground, and to output pad 122. In addition, power conditioner 140 receives ready signal 146 and provides protected supply voltage 148 and may also supply protected well voltage 150. Multiplexer 170 includes a first input that receives supply voltage VDD and a second input that receives the fractional pad voltage 166.

In the embodiment of FIG. 3A, power conditioner 140 includes a voltage drop element 194 coupled between output pad 122 and the second input of multiplexer 170. The voltage drop element 194 produces a voltage drop which causes the fractional pad voltage 166 to be a fraction of the voltage on output pad 122. In some embodiments, the fractional pad voltage 166 is about one half of the voltage on output pad 122. However, the invention is not limited in this respect. By way of example, the voltage drop element 194 can be a diode, two or more diodes connected in series, a resistor, a battery, or a combination of these elements. In each case, the voltage drop element is selected such that the difference between a specified maximum voltage on output pad 122 and the fractional pad voltage 166 does not overstress transistors in the differential current driver circuit.

Figure 4:
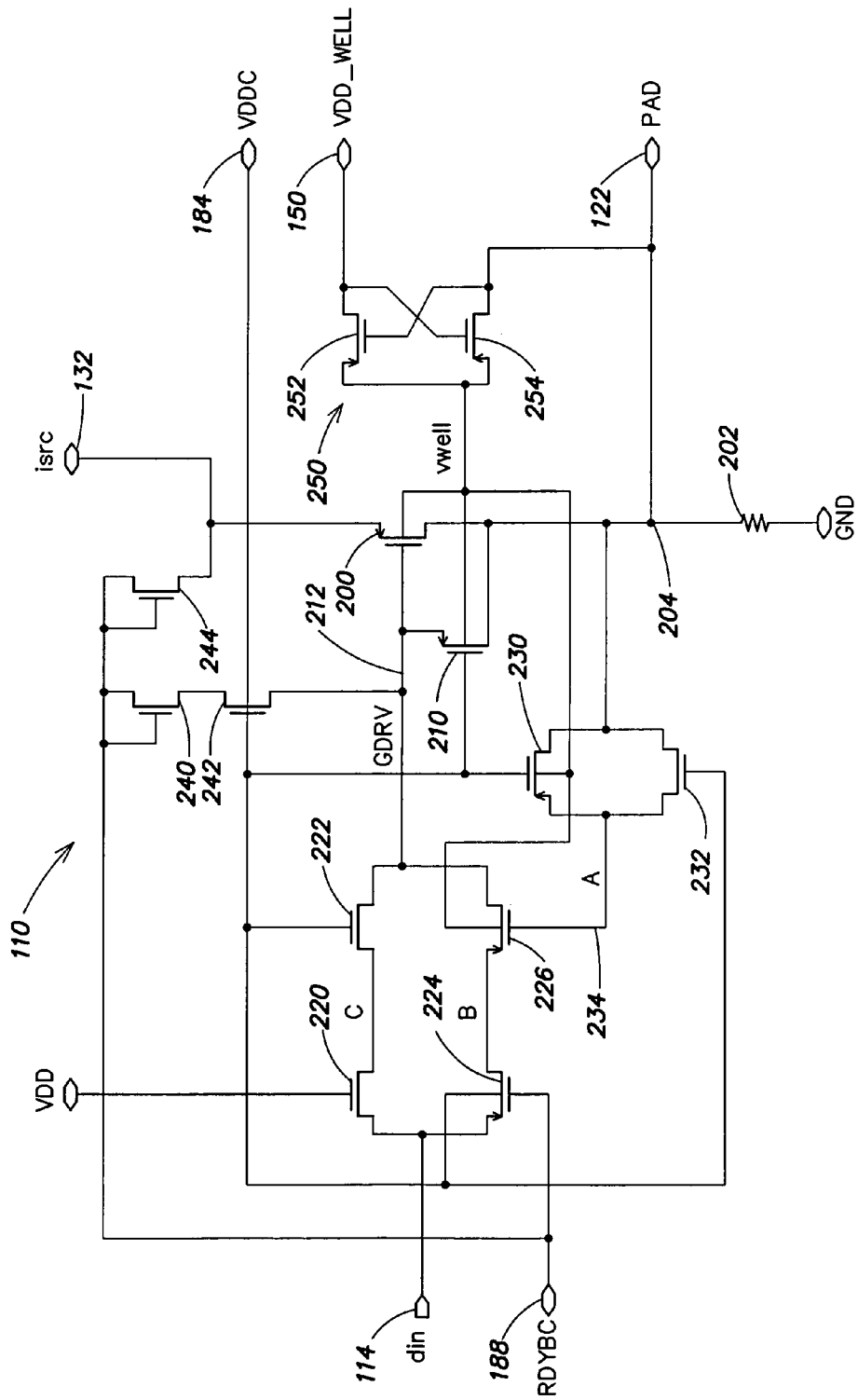
FIG. 4 is a schematic diagram of an implementation of one of the differential current output driver halfcells of FIG. 2 in accordance with an embodiment of the invention.

A schematic diagram of an implementation of driver halfcell 110 is shown in FIG. 4. Driver halfcell 112 may be implemented with the same circuit. In driver halfcell 110, a PMOS driver transistor 200 and a resistor 202 are coupled in series between current source input 132 and ground or another reference voltage that provides sufficient operating voltage. Resistor 202 may be replaced with an element such as a transistor operating as a resistor, or a combination of active elements and resistors. A node 204 connecting driver transistor 200 and resistor 202 is coupled to output pad 122. A PMOS transistor 210 is coupled between output pad 122 and a node 212, which is coupled to the gate of driver transistor 200. When the output pad 122 is pulled above supply voltage VDD, transistor 210 pulls node 212 up to the same voltage. A transmission gate formed by NMOS transistors 220 and 222 and PMOS transistors 224 and 226 couples input signal 114 to the gate of driver transistor 200 in normal operation. A transmission gate formed by PMOS transistor 230 and NMOS transistor 232 forces a node 234 to track output pad 122.

Driver circuit 110 receives the composite protected supply voltage 184 from max value detector 144. The gates of NMOS transistors 222, 232, and 242 and the gates of PMOS transistors 210 and 230 are connected to the composite protected supply voltage 184. The gate of NMOS transistor 220 is connected to supply voltage VDD, and the composite inverted ready signal 188 is connected to the gate of PMOS transistor 224 and to the gates and drains of NMOS transistors 240 and 244. In addition, the composite protected supply voltage 184 is connected to the well of PMOS transistor 224.

In normal operation when supply voltage VDD is present, composite protected supply voltage 184 is equal to supply voltage VDD and composite inverted ready signal 188 is near ground. Upon application of an electrical overvoltage to output pad 122, node 212 also sees the overvoltage. Transistor 242 protects transistor 240 from this overvoltage. When supply voltage VDD is not present, composite protected supply voltage 184 and composite inverted ready signal 188 are at the protected voltage. Transistor 244 pulls input 132 to the protected voltage, and transistors 240 and 242 pull node 212 to the protected voltage, if the overvoltage is on the opposite driver halfcell. This protects transistor 200 from overvoltage in both halfcells and avoids the possibility of shoot-through current from the opposite driver halfcell.

A mux 250 includes PMOS transistors 252 and 254. Transistor 252 receives the protected well voltage 150 from power conditioner 140, and transistor 254 is coupled to output pad 122. The output of mux 250 is coupled to the wells of PMOS transistors 200, 210, 226, and 230.

When supply voltage VDD is present and the pad voltage is less than VDD, the mux 250 provides supply voltage VDD to the back gate of transistor 200. If the pad voltage were to exceed supply voltage VDD, a large current can pass through the parasitic diode of transistor 200 to the supply voltage VDD. The mux 250 applies a maximum of VDD or the pad voltage to the well of transistor 200. When supply voltage VDD is absent, the pad voltage can exceed the maximum operating voltage of transistors 252 and 254. By applying the protected well voltage 150 to transistors 252 and 254, this problem is avoided.

Figure 5:
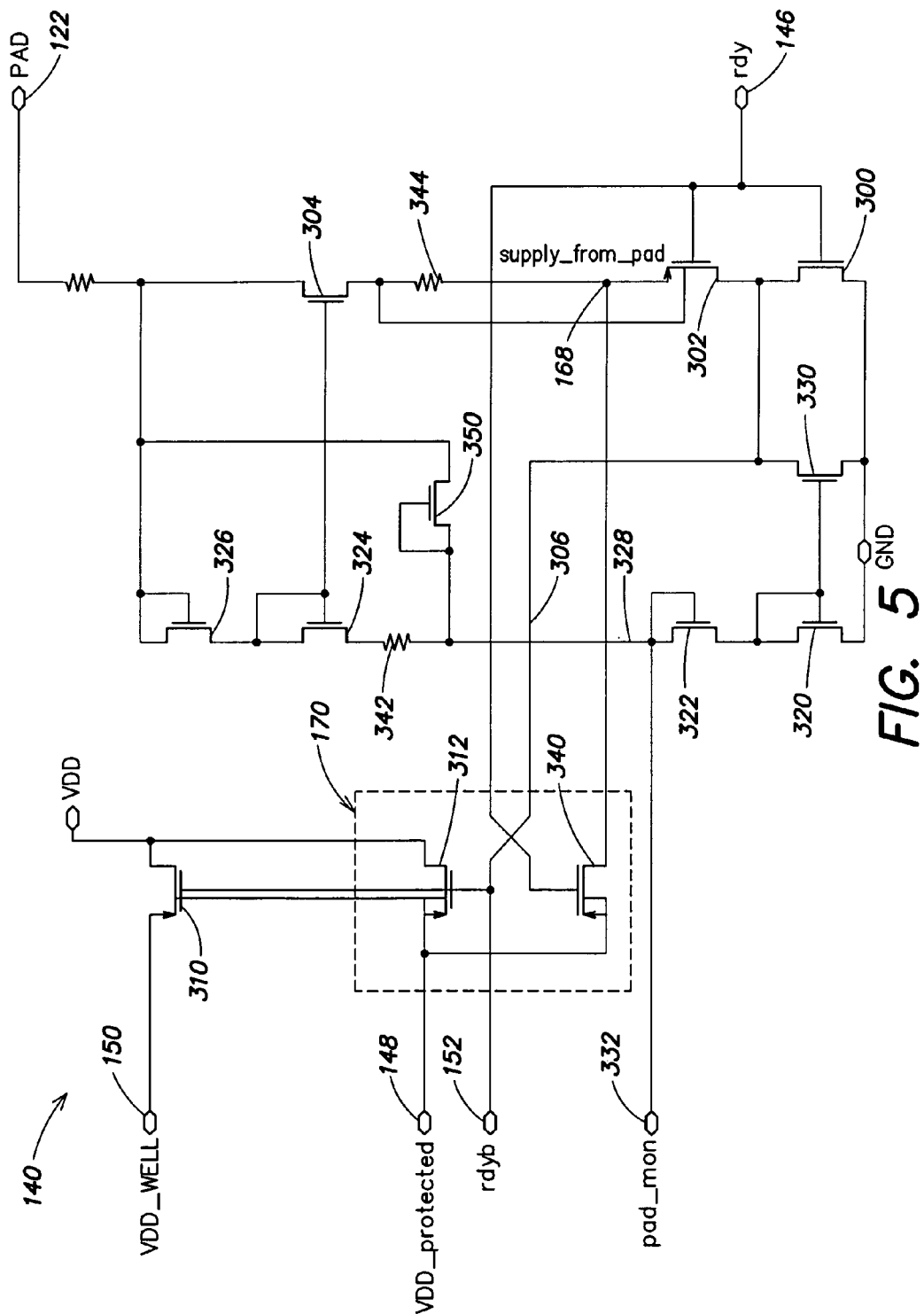
FIG. 5 is a schematic diagram of an implementation of one of the power conditioners of FIG. 2 in accordance with an embodiment of the invention.

A schematic diagram of an implementation of power conditioner 140 is shown in FIG. 5. Power conditioner 142 may be implemented with the same circuit. The power conditioner 140 generates the first protected supply voltage 148 and the first protected well voltage 150, based on the status of power supply voltage VDD and the voltage on output pad 122. The ready signal 146 tracks supply voltage VDD by direct connection to supply voltage VDD, by connection to a delayed version of supply voltage VDD, or by connection to a fractional version of supply voltage VDD.

If supply voltage VDD is present, ready signal 146 is high and node 306 (RDYB) is pulled low by NMOS transistor 300. PMOS transistor 302 isolates node 306 from node 168 and disables current through NMOS transistor 304. Under these conditions, the voltage on node 168 is near supply voltage VDD. This prevents high frequency signals on output pad 122 from being coupled through transistor 340 to the protected supply voltage during operation. When node 306 is low, transistor 312 turns on and supply voltage VDD passes through transistor 312 to provide the first protected supply voltage 148. In addition, when node 306 is low, transistor 310 turns on and supply voltage VDD passes through transistor 310 to provide the first protected well voltage 150.

Diode-connected NMOS transistors 320, 322, 324 and 326, and resistor 342 act as a voltage divider, with no device subjected to electrical overstress. A node 328 connected to transistor 322 and resistor 342 provides a divided pad voltage 332. Transistors 320, 322, 324 and 326 pass a small current that is not substantial until the voltage on output pad 122 reaches the process voltage limits. An NMOS transistor 330 mirrors this low current and, in conjunction with NMOS transistor 304, sets up the fractional pad voltage on node 168 to be approximately one-half of the voltage on output pad 122. Current mirror transistor 330 passes a current through transistor 302. With the ready signal 146 at a low level, the current through transistor 302 establishes a gate-source voltage Vgs on transistor 302. The current through transistors 330 and 302 also flows through transistor 304 and resistor 344. The currents in transistors 304 and 324 are therefore matched. In this embodiment, the current ratio is 1.0, but the ratio can be different. Thus, the gate-source voltage across transistor 304 is the same as the gate-source voltage across transistor 324, and the voltages on nodes 168 and 328 are approximately equal. If output pad 122 rises to 5.2 volts, the fractional pad voltage on node 168 rises to about 2.6 volts.

If supply voltage VDD is not present, ready signal 146 is low and node 306 is approximately equal to the fractional pad voltage on node 168. The voltage on node 306 is output as the inverted ready signal 152. The gate of transistor 340 receives the low ready signal 146, and the fractional pad voltage passes through transistor 340 to provide the protected supply voltage 148. The gate of transistor 312 receives the high level on node 306 and is turned off.

PMOS transistors 310, 312 and 340 share a common well which is connected to the protected supply voltage 148. In the case where supply voltage VDD is not present, transistor 310 is turned off by the high level on node 306. As a result, the protected supply voltage 148 is coupled via the well and the parasitic diode of transistor 310 to the protected well voltage 150 at high impedance. Thus, the protected supply voltage 148 and the protected well voltage 150 are both about one half the output pad voltage when supply voltage VDD is not present. In other embodiments, a separate protected well voltage is not utilized and the protected supply voltage 148 is coupled to wells of those transistors in driver halfcell 110 requiring protection.

If desired, resistors 342 and 344 may be selected to drop additional voltage. In other embodiments, resistors 342 and 344 may be replaced by alternate devices for additional voltage drop, or may be omitted. NMOS transistor 350 is used to quickly discharge the voltage divider if output pad 122 is driven low quickly. Transistor 350 is not necessary for operation of the circuit, but is useful in some applications.

Figure 6:
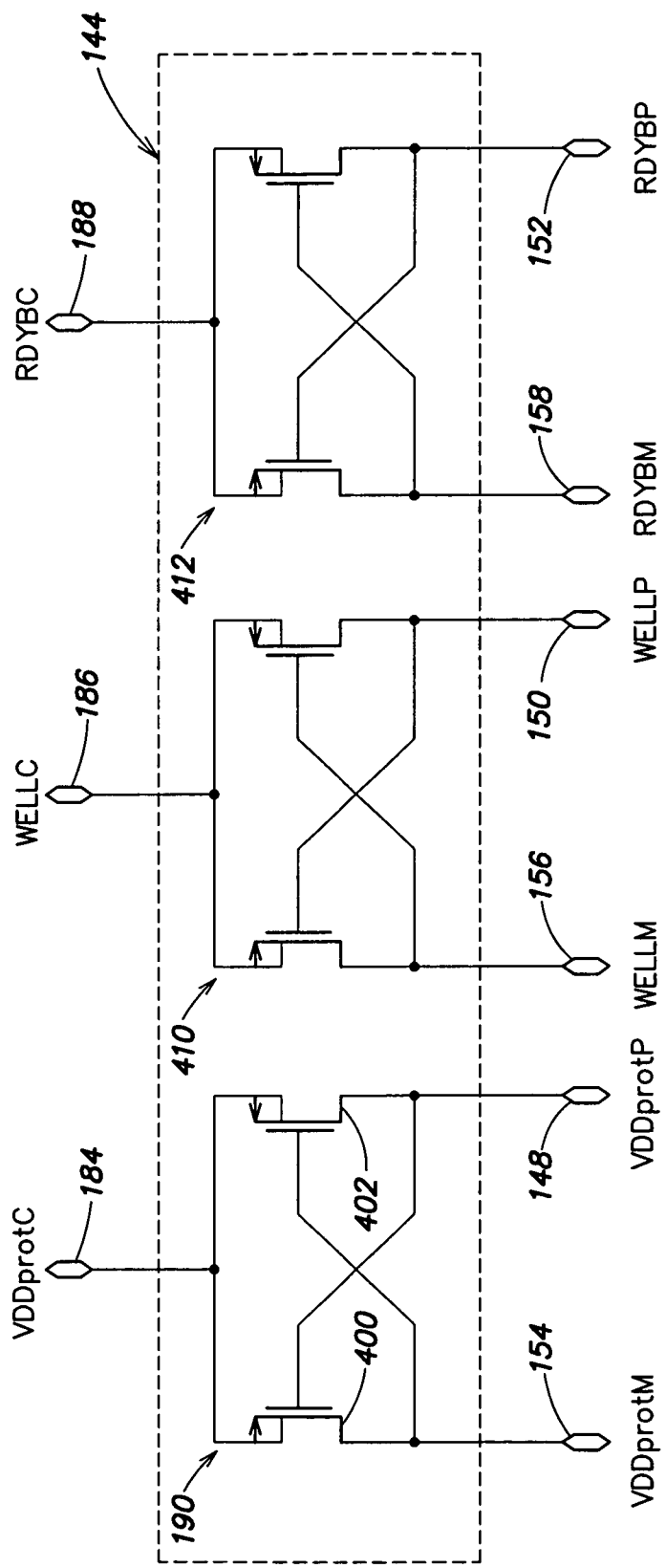
FIG. 6 is a schematic diagram of an implementation of the max value detector of FIG. 2 in accordance with an embodiment of the invention.

A schematic diagram of an implementation of max value detector 144 is shown in FIG. 6. The max value detector 144 generates the composite protected supply voltage 184 from protected supply voltages 148 and 154, generates the composite protected well voltage 186 from protected well voltages 150 and 156, and generates the composite inverted ready signal 188 from inverted ready signals 152 and 158. The max value detector 144 includes a maximum value selector for each pair of voltage values. Each maximum value selector may be implemented as a pair of PMOS transistors. Thus, maximum value selector 190 includes a PMOS transistor 400 that receives second protected supply voltage 154 at its drain and first protected supply voltage 148 at its gate. A PMOS transistor 402 receives first protected supply voltage 148 at its drain and second protected supply voltage 154 at its gate. The sources of the transistors 400 and 402 are coupled together to provide the composite protected supply voltage 184. A maximum value selector 410 that supplies the composite protected well voltage 186 and a maximum value selector 412 that provides the composite inverted ready signal 188 each may utilize the same circuit as maximum value selector 190.

The composite protected supply voltage 184 is supplied to gates of transistors in driver halfcells 110 and 112 that otherwise would be overstressed by the presence of a voltage on output pad 122 or 126, when power supply VDD is not present. Consider PMOS driver transistor 200 in FIG. 4 and assume a maximum voltage rating of 3.3 volts. If a voltage of 5.2 volts is applied to output pad 122 and the gate of transistor 200 is at ground due to supply voltage VDD being off, transistor 200 will be overstressed. The overvoltage is applied to the gate of transistor 200 through transistor 210. Transistor 244 applies the composite inverted ready signal 188 to current-source input 132 and thereby to the drain of driver transistor 200. The composite inverted ready signal 188 is the fractional pad voltage under these conditions. The fractional pad voltage is approximately one half the voltage on output pad 122, or about 2.6 volts for a voltage of 5.2 volts on output pad 122. Under these conditions, transistor 200 is subjected to the difference between the voltage on output pad 122 and the fractional pad voltage, or about 2.6 volts in the above example. Thus, transistor 200 is not overstressed. In a similar manner, other transistors in driver halfcells 110, 112 can be protected by applying the fractional pad voltage to one or more terminals of these transistors. The divider ratio of voltage dividers 160 and 170 is selected such that the difference between a specified maximum voltage on output pads 122 and 126 and the fractional pad voltage does not overstress transistors in the driver halfcells.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An output driver in an integrated circuit, comprising:
    a differential current output driver circuit operable by a power supply voltage and including first and second driver transistors in a differential current configuration and first and second output pads; and
    an overvoltage protection circuit comprising
        a first driver power conditioner configured to provide a first fractional pad voltage as a first protected voltage in response to an absence of the power supply voltage;
        a second driver power conditioner configured to provide a second fractional pad voltage as a second protected voltage in response to an absence of the power supply voltage; and
        a maximum value detector configured to select a maximum value of the first and second protected voltages and to provide the selected maximum value to the differential current output driver circuit as a composite protected voltage,
    wherein the overvoltage protection circuit is configured to generate a protected voltage in response to a voltage on at least one of the first and second output pads and an absence of the power supply voltage, and to apply the protected voltage to at least one transistor of the differential current output driver circuit.

2. An output driver as defined in claim 1, wherein the first driver power conditioner is configured to generate the first fractional pad voltage in response to a voltage on the first output pad and wherein the second driver power conditioner is configured to generate the second fractional pad voltage in response to a voltage on the second output pad.

3. An output driver as defined in claim 1, wherein each driver power conditioner includes a voltage divider circuit to generate the fractional pad voltage from the voltage on the output pad and a switching circuit to supply the fractional pad voltage as the protected supply voltage in response to an absence of the power supply voltage.

4. An output driver as defined in claim 1, wherein each driver power conditioner includes a voltage drop element to generate the fractional pad voltage from the voltage on the output pad and a switching circuit to supply the fractional pad voltage as the protected supply voltage in response to an absence of the power supply voltage.

5. An output driver as defined in claim 1, wherein each driver power conditioner is configured to generate the fractional pad voltage such that a difference between a specified maximum voltage on the output pad and the fractional pad voltage does not overstress transistors in the differential current output driver circuit.

6. An output driver as defined in claim 1, wherein the first driver power conditioner is configured to provide the first fractional pad voltage as a first protected supply voltage in response to an absence of the power supply voltage and to provide the power supply voltage as the first protected supply voltage in response to the presence of the power supply voltage, wherein the second driver power conditioner is configured to provide the second fractional pad voltage as a second protected supply voltage in response to an absence of the power supply voltage and to provide the power supply voltage as the second protected supply voltage in response to the presence of the power supply voltage, and wherein the maximum value detector is configured to select a maximum value of the first and second protected supply voltages and to provide the selected maximum value to the differential current output driver as a composite protected supply voltage.

7. An output driver as defined in claim 1, wherein the first driver power conditioner is configured to provide the first fractional pad voltage as a first inverted ready signal in response to an absence of the power supply voltage and to provide zero volts as the first inverted ready signal in response to the presence of the power supply voltage, and wherein the second driver power conditioner is configured to provide the second fractional pad voltage as a second inverted ready signal in response to an absence of the power supply voltage and to provide zero volts as the second inverted ready signal in response to the presence of the power supply voltage, and wherein the maximum value detector is configured to select a maximum value of the first and second inverted ready signals and to provide the selected maximum value to the differential current output driver as a composite inverted ready signal.

8. An output driver as defined in claim 1, wherein the first driver power conditioner is configured to provide the first fractional pad voltage as a first protected well voltage in the absence of the power supply voltage and to provide the power supply voltage as the first protected well voltage in the presence of the power supply voltage, wherein the second driver power conditioner is configured to provide the second fractional pad voltage as a second protected well voltage in the absence of the power supply voltage and to provide the power supply voltage as the second protected well voltage in response to the presence of the power supply voltage, and wherein the maximum value detector is configured to select a maximum value of the first and second protected well voltages and to provide the selected maximum value to the differential current output driver as a composite protected well voltage.

9. An output driver as defined in claim 1, wherein the differential current output driver circuit includes one or more transistors to be protected and wherein the composite protected supply voltage is coupled to one or more terminals of the transistors to be protected.

10. A method for overvoltage protection of a differential current output driver circuit in an integrated circuit, the differential current output driver circuit operable by a power supply voltage and including first and second output pads, the method comprising:
generating a first fractional pad voltage in response to a voltage on the first output pad;
providing the first fractional pad voltage as a first protected voltage in response to an absence of the power supply voltage;
generating a second fractional pad voltage in response to a voltage on the second output pad;
providing the second fractional pad voltage as a second protected voltage in response to an absence of the power supply voltage;
selecting a maximum value of the first and second protected voltages; and
providing the selected maximum value to at least one transistor of the differential current output driver circuit as a composite protected voltage.

11. A method as defined in claim 10, wherein generating a first fractional pad voltage and generating a second fractional pad voltage each comprises generating a fractional pad voltage such that a difference between a specified maximum voltage on the output pad and the fractional pad voltage does not overstress transistors in the differential current output driver circuit.

12. A method as defined in claim 10, wherein the differential current output driver circuit includes one or more transistors to be protected and wherein the composite protected supply voltage is applied to one or more terminals of the transistors to be protected.

13. A method as defined in claim 10, wherein the first protected voltage is a first protected supply voltage, the second protected voltage is a second protected supply voltage, and the composite protected voltage is a composite protected supply voltage, the method further comprising:
providing the power supply voltage as the first protected supply voltage in response to the presence of the power supply voltage; and
providing the power supply voltage as the second protected supply voltage in response to the presence of the power supply voltage.

14. A method as defined in claim 10, wherein generating the first fractional pad voltage comprises dividing the voltage on the first output pad to provide the first fractional pad voltage and wherein generating the second fractional pad voltage comprises dividing the voltage on the second output pad to provide the second fractional pad voltage.

15. A method as defined in claim 10, wherein generating the first fractional pad voltage comprises dropping the voltage on the first output pad to provide the first fractional pad voltage and wherein generating the second fractional pad voltage comprises dropping the voltage on the second output pad to provide the second fractional pad voltage.

16. A method for overvoltage protection of a differential current output driver circuit in an integrated circuit, the differential current output driver circuit operable by a power supply voltage and including first and second output pads, the method comprising:
generating a protected voltage in response to a voltage on at least one of the output pads and an absence of the power supply voltage, wherein generating the protected voltage comprises
generating a first fractional pad voltage in response to a voltage on the first output pad;

providing the first fractional pad voltage as a first inverted ready signal in response to an absence of the power supply voltage;

providing zero volts as the first inverted ready signal in response to the presence of the power supply voltage;

generating a second fractional pad voltage in response to a voltage on the second output pad;

providing the second fractional pad voltage as a second inverted ready signal in response to an absence of the power supply voltage;

providing zero volts as the second inverted ready signal in response to the presence of the power supply voltage;

selecting a maximum value of the first and second inverted ready signals; and providing the selected maximum value to the differential current output driver circuit as a composite inverted ready signal; and applying the protected voltage to at least one transistor of the differential current output driver.

17. A method as defined in claim 10, wherein the first protected voltage is a first protected well voltage, the second protected voltage is a second protected well voltage, and the composite protected voltage is a composite protected well voltage, the method further comprising:

providing the power supply voltage as the first protected well voltage in response to the presence of the power supply voltage; and providing the power supply voltage as the second protected well voltage in response to the presence of the power supply voltage.

* * * * *